(12) United States Patent
Wu et al.

(10) Patent No.: US 8,411,506 B2
(45) Date of Patent: Apr. 2, 2013

(54) NON-VOLATILE MEMORY AND OPERATING METHOD OF MEMORY CELL

(75) Inventors: Guan-Wei Wu, Hsinchu (TW); I-Chen Yang, Hsinchu (TW); Yao-Wen Chang, Hsinchu (TW); Tao-Cheng Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 159 days.

(21) Appl. No.: 12/949,076

(22) Filed: Nov. 18, 2010

(65) Prior Publication Data

US 2012/0127795 A1    May 24, 2012

(51) Int. Cl.
*G11C 16/04* (2006.01)
*H01L 29/788* (2006.01)
*H01L 29/66* (2006.01)

(52) U.S. Cl. ......... 365/185.14; 365/185.02; 365/185.18; 257/317; 257/319; 257/322

(58) Field of Classification Search .............. 365/185.14
See application file for complete search history.

(56) References Cited

U.S. PATENT DOCUMENTS

| 6,228,715 | B1 * | 5/2001 | Shimoji ........................ 438/264 |
| 6,804,149 | B2 * | 10/2004 | Ogura et al. ............. 365/185.18 |
| 6,897,517 | B2 * | 5/2005 | Van Houdt et al. ........... 257/315 |
| 6,936,891 | B2 * | 8/2005 | Saito et al. .................... 257/331 |
| 7,273,786 | B2 * | 9/2007 | Mikolajick ................... 438/270 |

\* cited by examiner

*Primary Examiner* — Son Mai
(74) *Attorney, Agent, or Firm* — J.C. Patents (57) ABSTRACT

A non-volatile memory and a manufacturing method thereof and a method for operating a memory cell are provided. The non-volatile memory includes a substrate, first and second doped regions, a charged-trapping structure, first and second gates and an inter-gate insulation layer. The first and second doped regions are disposed in the substrate and extend along a first direction. The first and second doped regions are arranged alternately. The charged-trapping structure is disposed on the substrate. The first and second gates are disposed on the charged-trapping structure. Each first gate is located above one of the first doped regions. The second gates extend along a second direction and are located above the second doped regions. The inter-gate insulation layer is disposed between the first gates and the second gates. Adjacent first and second doped regions and the first gate, the second gate and the charged-trapping structure therebetween define a memory cell.

20 Claims, 7 Drawing Sheets

NON-VOLATILE MEMORY AND OPERATING METHOD OF MEMORY CELL

BACKGROUND OF THE INVENTION

1. Field of Invention

The invention relates to a non-volatile memory and a manufacturing method thereof, and an operating method of a memory cell, and more particularly, to a non-volatile memory capable of avoiding a second bit effect and a manufacturing method thereof, and an operating method of a memory cell.

2. Description of Related Art

A non-volatile memory is able to retain the stored data even when the electrical power is off. As a result, many electronic products have such memories to provide normal operations when booted. In particular, a flash memory allows multiple data writing, reading, and erasing operations. With these advantages, the flash memory has become one of the most widely adopted memory devices in personal computers and electronic equipments.

A charge-trapping flash memory is a common flash memory. In the charge-trapping flash memory, two-bit data can be stored in a charge-trapping structure of oxide-nitride-oxide layer (i.e. the well-known ONO layer). In general, two-bit data can be stored respectively on the left side (i.e. the left bit) and the right side (i.e. the right bit) of the nitride layer in the charge-trapping structure.

However, the charge-trapping flash memory has a second bit effect. That is, a reading operation performed to the left bit is affected by the right bit, or a reading operation performed to the right bit is affected by the left bit. In addition, the second bit effect becomes worsen with the gradual reduction in the size of a memory, thereby affecting the operation window of the memory and the performance of the device.

SUMMARY OF THE INVENTION

An embodiment of the present invention provides a non-volatile memory capable of avoiding a second-bit effect during operation.

Another embodiment of the present invention provides a manufacturing method of a non-volatile memory, and the manufacturing method is capable of forming a non-volatile memory with a larger operation window.

Another embodiment of the present invention provides an operating method of a memory cell, and the operation method is capable of effectively enhancing the performance of the device.

An embodiment of the present invention provides a non-volatile memory including a substrate, a plurality of first doped regions each having a stripe shape, a plurality of second doped regions each having a stripe shape, a charge-trapping structure, a plurality of first gates each having a stripe shape, a plurality of second gates each having a stripe shape and an inter-gate insulating layer. The first doped regions are disposed in the substrate and extend along a first direction. The second doped regions are disposed in the substrate and extend along the first direction, wherein the first doped regions and the second doped regions are arranged alternately. The charge-trapping structure is disposed on the substrate. The first gates are disposed on the charge-trapping structure and extend along the first direction, wherein each first gate is disposed on one of the first doped regions. The second gates are disposed on the charge-trapping structure, extend along a second direction and located on the second doped regions, wherein the second direction is different from the first direction. The inter-gate insulating layer is disposed between the first gates and the second gates. A first doped region, a second doped region adjacent to the first doped region, and a first gate, a second gate and the charge-trapped structure which are disposed between the first doped region and the second doped region define a memory cell.

According to an embodiment of the present invention, a width of each first gate is greater than a width of each first doped region.

According to an embodiment of the present invention, the substrate has a plurality trenches therein, each first doped region is disposed below one of the trenches, each first gate is disposed on a bottom of one of the trenches, and the second gates fill in the trenches in the second direction.

According to an embodiment of the present invention, the charge-trapping structure is a composite structure including a bottom oxide layer, a charge-trapping layer and a top oxide layer.

According to an embodiment of the present invention, a material of the charge-trapping layer includes nitride or a high-k material.

According to an embodiment of the present invention, the high-k material includes $HfO_2$, $TiO_2$, $ZrO_2$, $Ta_2O_5$ or $Al_2O_3$.

Another embodiment of the present invention provides a manufacturing method of a non-volatile memory. A substrate is provided. A charge-trapping structure is formed on the substrate. A plurality of first insulating layers each having a strip shape are formed on the charge-trapping structure, wherein the first insulating layers extend along a first direction. Conductive spacers are formed on sidewalls of each first insulating layer, wherein the conductive spacers extend along the first direction. An ion implantation process is performed by using the first insulating layers and the conductive spacers as a mask, so as to form a plurality of doped regions each having a stripe shape in the substrate, wherein the doped regions extend along the first direction. A first conductive layer is formed on the charge-trapping structure, wherein the first conductive layer covers the conductive spacers and exposes the first insulating layers. A second insulating layer is formed on the first conductive layer and the first insulating layers, wherein the second insulating layer exposes a portion of the first conductive layer in the first direction. A second conductive layer is formed on the second insulating layer and the first conductive layer. The second conductive layer and the portion of the first conductive layer exposed by the second insulating layer are patterned, so as to form a plurality of third conductive layers each having a stripe shape in a second direction, wherein the second direction is different from the first direction.

According to an embodiment of the present invention, a first insulating layer and conductive spacers on sidewalls of the first insulating layer have a total width, and a width of the first insulating layer is greater than one-fourth of the total width and less than half of the total width.

According to an embodiment of the present invention, a method of forming the first conductive layer includes: forming a conductive material layer on the charge-trapping layer covering the first insulating layers and the conductive spacers; and performing a planarization process, so as to remove a portion of the conductive material layer until the first insulating layers are exposed.

According to an embodiment of the present invention, a method of forming the second insulating layer includes: forming an insulating material layer on the first conductive layer and the first insulating layers; and performing a patterning process, so as to remove a portion of the insulating material layer in the first direction.

Another embodiment of the present invention provides a manufacturing method of a non-volatile memory. A substrate is provided. A plurality of trenches are formed in the substrate, wherein the trenches extend in a first direction. A charge-trapping structure is formed on the substrate. A plurality of doped regions are formed between the trenches and in the substrate at bottoms of the trenches, wherein the doped regions extend along the first direction. A first conductive layer is formed on the bottoms of the trenches, wherein the first conductive layer extends along the first direction. An insulating layer is formed on the first conductive layer. A plurality of second conductive layers each having a stripe shape are formed on the charge-trapping layer in a second direction, wherein the second conductive layers fill in the trenches, and the second direction is different from the first direction.

According to an embodiment of the present invention, a method of forming the first conductive layer includes: forming a conductive material layer on the charge-trapping structure filling up the trenches; and performing an etching process, so as to remove a portion of the conductive material layer and retain a portion of the conductive material layer on the bottoms of the trenches.

According to an embodiment of the present invention, a method of forming the insulating layer includes: forming an insulating material layer on the charge-trapping structure filling up the trenches; and performing an etching process, so as to remove a portion of the insulating material layer and retain a portion of the insulating material layer on the first conducive layer.

According to an embodiment of the present invention, a method of forming the second conductive layers includes: forming a conductive material layer on the charge-trapping structure filling up the trenches; and performing a pattering process, so as to remove a portion of the conductive material layer in the second direction.

Another embodiment of the present invention further provides an operating method of a memory cell. The above-mentioned memory cell is provided. When a programming operation is performed, a first voltage is applied to the first gate; a second voltage is applied to the second gate; a third voltage is applied to the first doped region; a fourth voltage is applied to the second doped region; and a fifth voltage is applied to the substrate.

According to an embodiment of the present invention, when the programming operation is executed through a channel hot electron (CHE) injection, the first voltage and the second voltage are substantially the same, wherein the first voltage is from 9 V to 13 V; the second voltage is from 9 V to 13 V; one of the third voltage and the fourth voltage is 0 V while the other is from 3.5 V to 5.5 V; and the fifth voltage is 0 V.

According to an embodiment of the present invention, when the programming operation is executed through an enhanced CHE injection, one of the first voltage and the second voltage is from 9 V to 13 V while the other is from 1.5 V to 3 V; one of the third voltage and the fourth voltage is from 0 V while the other is from 3.5 V to 5.5 V; and the fifth voltage is 0 V.

According to an embodiment of the present invention, the operating method further includes performing an erasing operation after performing the programming operation, wherein when the erasing operation is performed, a sixth voltage is applied to the first gate; a seventh voltage is applied to the second gate; a eighth voltage is applied to the first doped region; a ninth voltage is applied to the second doped region; and a tenth voltage is applied to the substrate.

According to an embodiment of the present invention, when the erasing operation is executed through a band-to-band hot hole (BBHH), one of the sixth voltage and the seventh voltage is 0 V, floating or from −11 V to −15 V while the other is from −11 V to −15 V; one of the eighth voltage and the ninth voltage is 0 V or floating while the other is from 4 V to 5 V; and the tenth voltage is 0 V.

According to an embodiment of the present invention, the operating method further includes performing a reading operation after performing the programming operation, wherein when the reading operation is performed, an eleventh voltage is applied to the first gate; a twelfth voltage is applied to the second gate; a thirteenth voltage is applied to the first doped region; a fourteenth voltage is applied to the second doped region; and a fifteenth voltage is applied to the substrate.

According to an embodiment of the present invention, one of the eleventh voltage and the twelfth voltage is from 5 V to 9.5 V while the other is from 0 V to 6 V; one of the thirteenth voltage and the fourteenth voltage is from 0.7 V to 1.6 V while the other is 0 V; and the fifteenth voltage is 0 V.

Another embodiment of the present invention provides a manufacturing method of a non-volatile memory. A substrate is provided. A plurality of first doped regions each having a stripe shape and a plurality of second doped regions each having a stripe shape are formed in the substrate, wherein the first doped regions and the second doped regions extend along a first direction and are arranged alternately. A charge-trapping structure is formed on the substrate. A plurality of first gates each having a stripe shape are formed on the charge-trapping structure, wherein the first gates extend along the first direction, and each first gate is disposed on one of the first doped regions. A plurality of second gates each having a stripe shape are formed on the charge-trapping structure, wherein the second gates extend along a second direction and are disposed on the second doped regions, and the second direction is different from the first direction. An inter-gate insulating layer is formed between the first gates and the second gates.

According to an embodiment of the present invention, a method of forming the first gates, the second gates and the inter-gate insulating layer includes the following steps. A plurality of first insulating layers each having a stripe shape are formed on the charge-trapping layer, wherein the first insulating layers extend along the first direction. Conducive spacers are formed on sidewalls of each first insulating, wherein the conductive spacers extend along the first direction. A first conductive layer is formed on the charge-trapping layer, wherein the first conductive layer covers the conductive spacers and exposes the first insulating layers. A second insulating layer is formed on the first conductive layer and the first insulating layers, wherein the second insulating layer exposes a portion of the first conductive layer in the first direction. A second conductive layer is formed on the second insulating layer and the first conductive layer. The second conductive layer and the portion of the first conductive layer exposed by the second insulating layer are patterned, so as to form a plurality of third conductive layers each having a stripe shape in the second direction, wherein the third conductive layers and the first conductive layer thereunder form the second gates.

According to an embodiment of the present invention, a method of forming the first doped regions and the second doped regions includes performing an ion implantation process by using the first insulating layers and the conductive spacers as a mask.

In view of the above, in the above-mentioned embodiments of the present invention, the non-volatile memory has the first gates and the second gates crossover the first gates, so that each memory cell has two gates. Therefore, when a programming operation is performed, appropriate voltages are respectively applied to the first gate and the second gate of each memory cell to execute CHE injection or enhanced CHE injection, and thus, the programming efficiency is increased and the performance of the device is enhanced. Further, when a reading operation is performed to the memory cell, a high voltage is applied to the gate at the non-reading side, so as to inhibit the second bit effect and increase the operation window. In addition, when a reading operation is performed to the memory cell, a high voltage is applied to the gate at the non-reading side to inhibit the second bit effect, and thus, applying a high voltage to the doped region below the gate at the non-reading side to inhibit the second bit effect in the conventional techniques is not required, and the reading disturbance is effectively alleviated.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
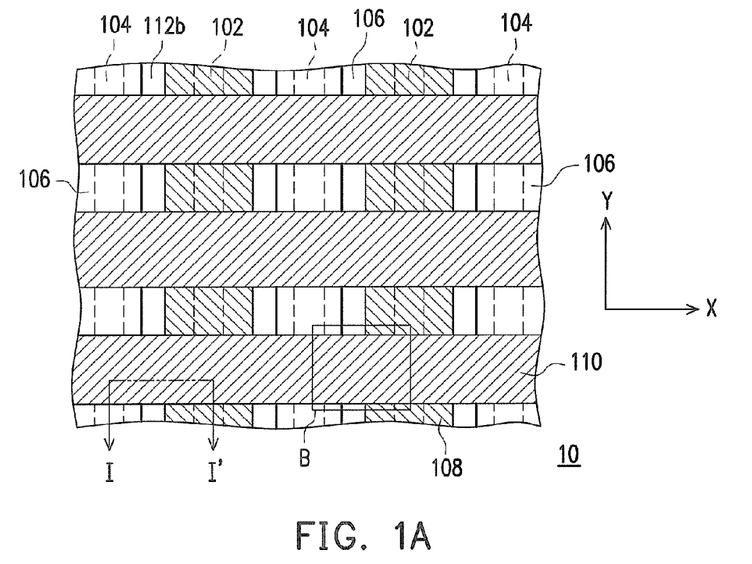
FIG. 1A schematically illustrates a top view of a non-volatile memory according to an embodiment of the present invention.
Figure 1B:
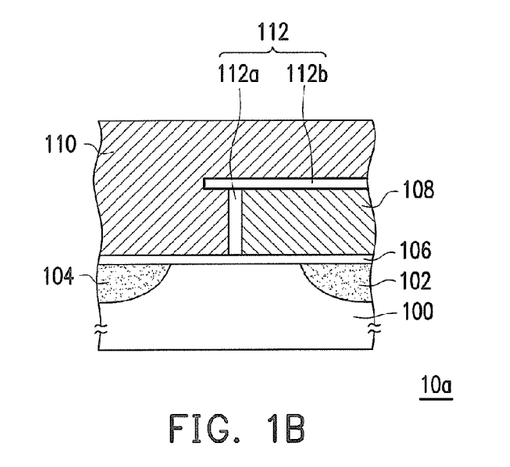
FIG. 1B schematically illustrates a cross-sectional view of a memory cell taken along the cross-section I-I' of FIG. 1A.

Reference will now be made in detail to the present preferred embodiments of the invention, examples of which are illustrated in the accompanying drawings. Wherever possible, the same reference numbers are used in the drawings and the description to refer to the same or like parts.
First Embodiment FIG. 1A schematically illustrates a top view of a non-volatile memory according to an embodiment of the present invention. FIG. 1B schematically illustrates a cross-sectional view of a memory cell taken along the cross-section I-I' of FIG. 1A. Referring to FIGS. 1A and 1B, a non-volatile memory includes a substrate 100, a plurality of first doped regions 102 each having a stripe shape, a plurality second doped regions 104 each having a stripe shape, a charge-trapping structure 106, a plurality of first gates 108 each having a stripe shape, a plurality of second gates 110 each having a stripe shape and an inter-gate insulating layer 112. The substrate 100 can be a silicon substrate or a silicon-on-insulator (SOI) substrate. The first doped regions 102 and the second doped regions 104 are disposed in the substrate 100 and extend along a first direction Y. The first doped regions 102 and the second doped regions 104 are arranged alternately. The first doped regions 102 serve as sources and the second doped regions 104 serve as drains. Alternatively, the first doped regions 102 serve as drains and the second doped regions 104 serve as sources. The charge-trapping structure 106 is disposed on the substrate 100. The charge-trapping structure 106 is a composite structure including a bottom oxide layer, a charge-trapping layer and a top oxide layer, wherein the bottom oxide layer serves as a tunnelling dielectric layer, and the top oxide layer serves as a charge blocking layer. The material of the charge-trapping layer includes nitride or a dielectric material (such as $HfO_2$, $TiO_2$, $ZrO_2$, $Ta_2O_5$ or $Al_2O_3$). The thickness of the bottom oxide is from 40 angstroms to 50 angstroms. The thickness of the charge-trapping layer is from 60 angstroms to 100 angstroms. The thickness of the top oxide is from 70 angstroms to 110 angstroms.

The first gates 108 are disposed on the charge-trapping layer 106 and extend along the first direction Y, and each first gate 108 is disposed on one first doped region 102. The width of each first gate 108 is greater than the width of each first doped region 102, for example. The second gates 110 are disposed on the charge-trapping layer 106, extend along a second direction X and are located on the second doped regions 104. The first direction Y is different from the second direction X. In this embodiment, the first direction Y is perpendicular to the second direction X. The material of the first gates 108 and the second gates 110 is polysilicon, for example. The inter-gate insulating layer 112 is disposed between the first gates 108 and the second gates 110. The inter-gate insulating layer 112 includes an inter-gate insulating layer 112a located on tops of the first gates 108 and an inter-gate insulating layer 112b located on sidewalls of the first gates 108.

In this embodiment, a first doped region 102, a second doped region 104 adjacent to the first doped region 102, and a first gate 108, a second gate 110 and the charge-trapped structure 106 which are disposed therebetween define a memory cell 10a, as shown in the region surrounded by the block B in FIG. 1A. In the memory cell 10a, a portion of the first gate 108 is disposed on the first doped region 102, and a portion of the second gate 110 is disposed on the second doped region 104. Further, the second gate 110 not only is disposed on the charge-trapping layer 106, but also covers the top of the first gate 108. The first gate 108 and the second gate 110 are separated from each other by the inter-gate insulating layer 112a and the inter-gate insulating layer 112b.

The manufacturing method of the non-volatile memory 10 is described by the cross-section I-I' in FIG. 1A in the following.

FIGS. 2A to 2D schematically illustrate cross-sectional views of a process flow of the non-volatile memory taken along the cross-section I-I' of FIG. 1A. In FIGS. 2A to 2D, the same elements with FIGS. 1A and 1B are represented by same reference numbers, and the details are not iterated herein. First, referring to FIG. 2A, a substrate 100 is provided.

Figure 2A:
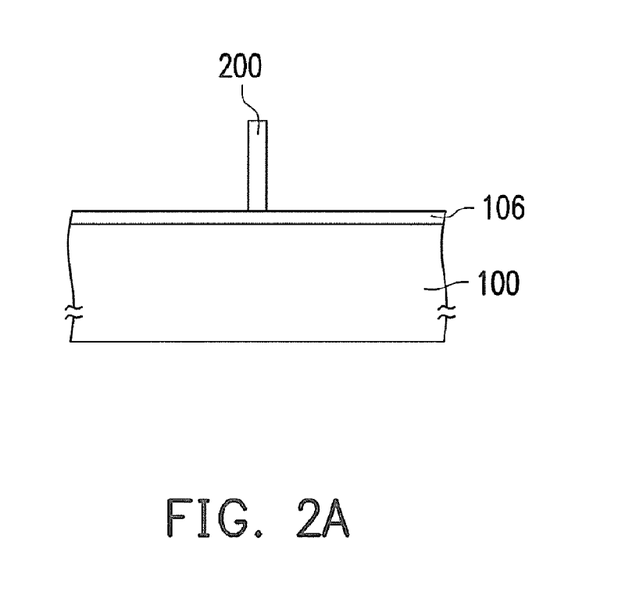
FIGS. 2A to 2D schematically illustrate cross-sectional views of a process flow of the non-volatile memory taken along the cross-section I-I' of FIG. 1A.

Thereafter, a charge-trapping structure 106 is formed on the substrate 100. A first insulating layer 200 having a strip shape is formed on the charge-trapping structure 106. The first insulating layer 200 extends along a first direction Y. The first insulating layer 200 forms the inter-gate insulating layer 112*a* in FIG. 1B. The method of forming the first insulating layer 200 includes forming an insulating material layer on the charge-trapping layer 106, and then performing a patterning process.

Figure 2B:
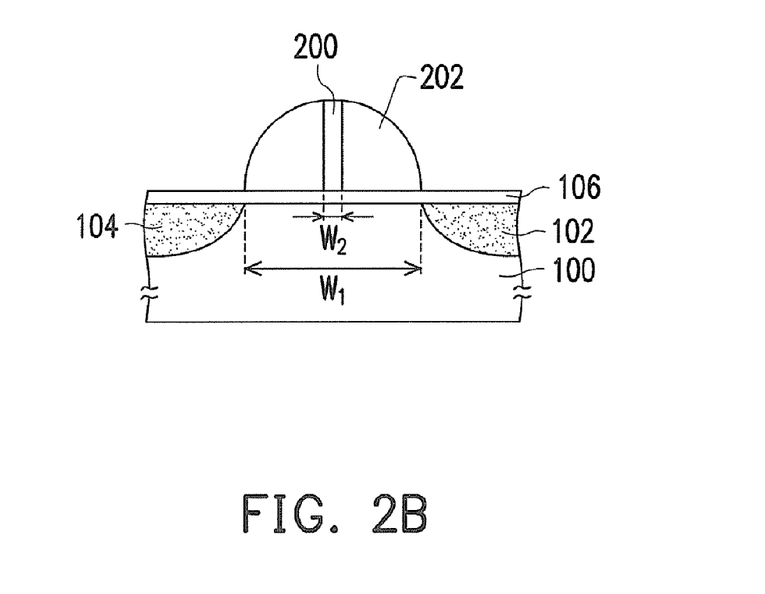

Referring to FIG. 2B, conductive spacers 202 are formed on sidewalls of the first insulating layer 200. The conductive spacers 202 extend along the first direction Y. The material of the conductive spacers 202 is polysilicon, for example. In this embodiment, the first insulating layer 200 and conductive spacers 202 on sidewalls of the first insulating layer 200 have a total width W1, and a width W2 of the first insulating layer 200 is greater than one-fourth of the total width W1 and less than half of the total width W1. Thereafter, an ion implantation process is performed by using the first insulating layer 200 and the conductive spacers 202 as a mask, so as to form a first doped region 102 having a stripe shape and a second doped region 104 having a stripe shape in the substrate 100. The first doped region 102 and the second doped region 104 extend along the first direction in FIG. 1A.

Figure 2C:
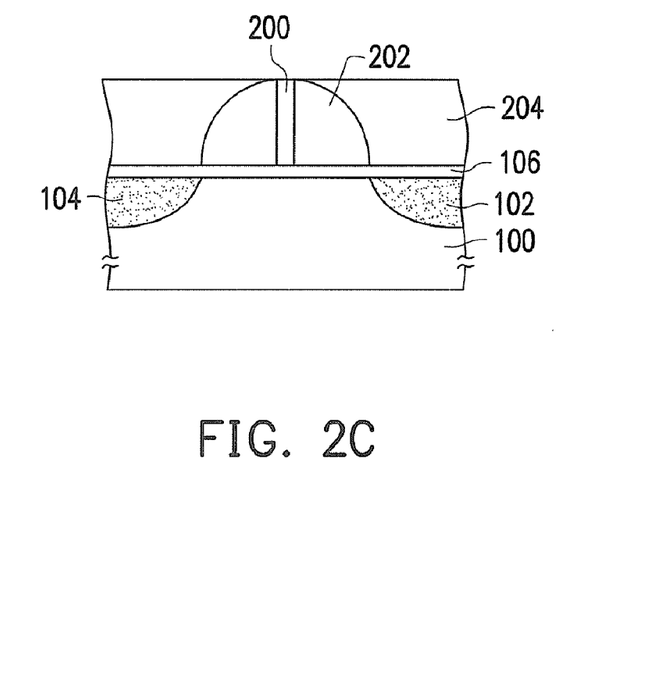

Referring to FIG. 2C, a first conductive layer 204 is formed on the charge-trapping structure 106. The first conductive layer 204 covers the conductive spacers 202 and exposes the first insulating layer 200. The material of the first conductive layer 204 is polysilicon, for example. The method of forming the first conductive layer 204 includes forming a conductive material layer on the charge-trapping layer 106 covering the first insulating layer 200 and the conductive spacers 202; and performing a planarization process to remove a portion of the conductive material layer until the first insulating layer 200 are exposed.

Figure 2D:
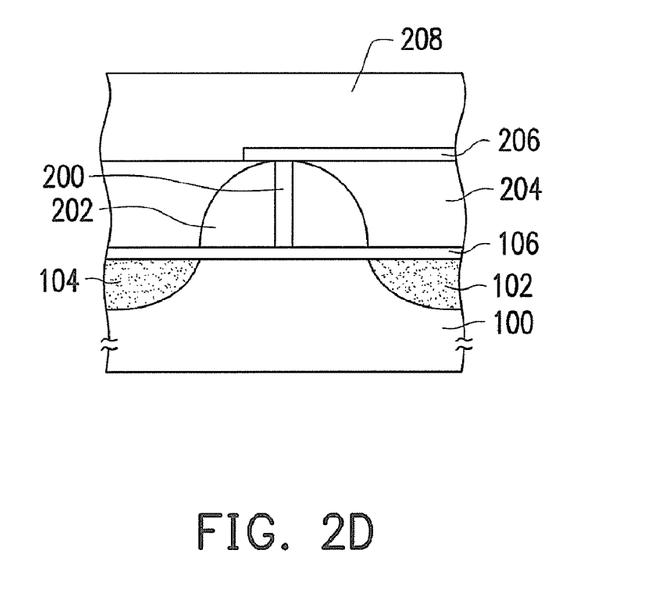

Referring to FIG. 2D, a second insulating layer 206 is formed on the first conductive layer 204 and the first insulating layer 200. The second insulating layer 206 exposes a portion of the first conductive layer 204 in the first direction Y in FIG. 1A. The second insulating layer 206 is the inter-gate insulating layer 112*b* in FIG. 1B. The method of forming the second insulating layer 206 includes forming an insulating material layer on the first conductive layer 204 and the first insulating layer 200, and then performing a patterning process to remove a portion of the insulating material layer in the first direction Y. Thereafter, a second conductive layer 208 is formed on the second insulating layer 206 and the first conductive layer 204. The material of the second conductive layer 208 is polysilicon, for example. Afterwards, the second conductive layer 208 and the portion of the first conductive layer 204 exposed by the second insulating layer 206 are patterned, so as to form a third conductive layer having a stripe shape in a second direction X. The third conductive layer is formed by the patterned second conductive layer 208 and the first conductive layer 204 disposed thereunder, and the charge-trapping structure 106 is exposed between the adjacent two third conductive layers.

In this embodiment, the conductive spacers 202 and the first conducive layer 204 which are covered by the first insulating layer 200 and the second insulating layer 206 (i.e. the conductive spacer 202 and the first conductive layer 204 on the right side of the first insulating layer 200 in FIG. 2D) form the first gate 108 in FIGS. 1A and 1B. Further, the patterned conductive layer 208 and the first conductive layer 204 thereunder (i.e. the first conductive layer 204 and the second conductive layer 208 on the left side of the first insulating layer 200 in FIG. 2D) form the second gate 110 in FIGS. 1A and 1B.

Second Embodiment

Figure 3A:
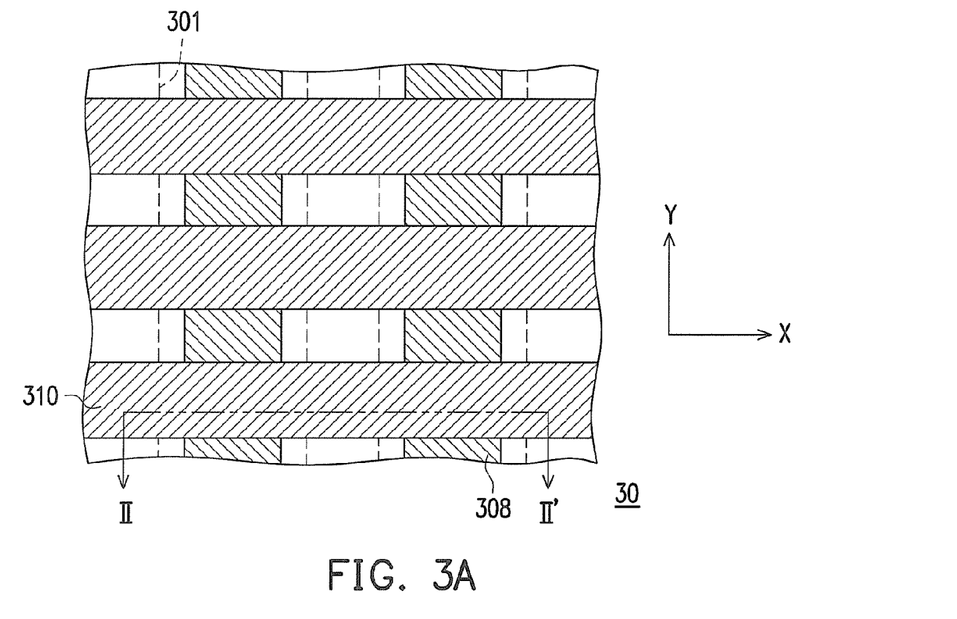
FIG. 3A schematically illustrates a top view of a non-volatile memory according to another embodiment of the present invention.
Figure 3B:
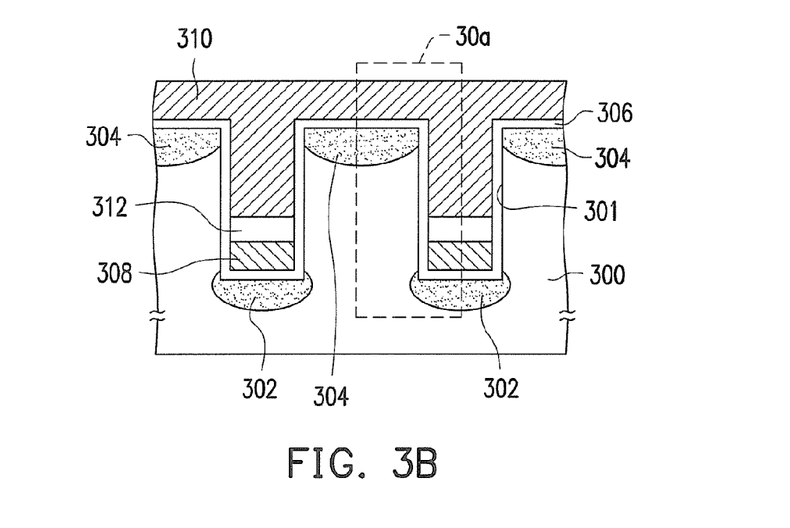
FIG. 3B schematically illustrates a cross-sectional view of a memory cell taken along the cross-section II-II' of FIG. 3A.

FIG. 3A schematically illustrates a top view of a non-volatile memory according to another embodiment of the present invention. FIG. 3B schematically illustrates a cross-sectional view of a memory cell taken along the cross-section II-II' of FIG. 3A. Referring to FIGS. 3A and 3B, a non-volatile memory 30 includes a substrate 300, a plurality of first doped regions 302 each having a stripe shape, a plurality second doped regions 304 each having a stripe shape, a charge-trapping structure 306, a plurality of first gates 308 each having a stripe shape, a plurality of second gates 310 each having a stripe shape and an inter-gate insulating layer 312. The substrate 300 can be a silicon substrate or a silicon-on-insulator (SOI) substrate. The substrate 300 has a plurality of trenches 301 therein extending along a first direction Y. The first doped regions 302 and the second doped regions 304 are disposed in the substrate 300 and extend along the first direction. Each first doped region 302 is disposed below one trench 301. The second doped regions 304 and the trenches 301 are arranged alternately. The first doped regions 302 serve as sources and the second doped regions 304 serve as drains. Alternatively, the first doped regions 302 serve as drains and the second doped regions 304 serve as sources. The charge-trapping structure 306 is conformally formed on the substrate 300. The charge-trapping structure 306 is the same with the charge-trapping structure 106 in the first embodiment, and the details are not iterated herein.

Each first gate 308 is disposed on a bottom of one trench 301 and located on the charge-trapping layer 306, and extends along the first direction Y. The second gates 310 are disposed on the charge-trapping layer 306, extend along a second direction X, and are located on the second doped regions 304. The first direction Y is different from the second direction X. In this embodiment, the first direction Y is perpendicular to the second direction X. Further, the second gates 310 fill in the trenches 301 in the second direction X. The material of the first gates 308 and the second gates 310 is polysilicon, for example. The inter-gate insulating layer 312 is disposed in the trenches 301, and between the first gates 308 and the second gates 310 so as to insulate the first gates 308 from the second gates 310.

In this embodiment, a first doped region 302, a second doped region 304 adjacent to the first doped region 302, and a first gate 308, a second gate 310 and the charge-trapped structure 306 which are disposed therebetween define a memory cell 30*a*, as shown in the region surrounded by the dotted line in FIG. 3B.

The manufacturing method of the non-volatile memory 30 is described by the cross-section II-II' in FIG. 3A in the following.

Figure 4A:
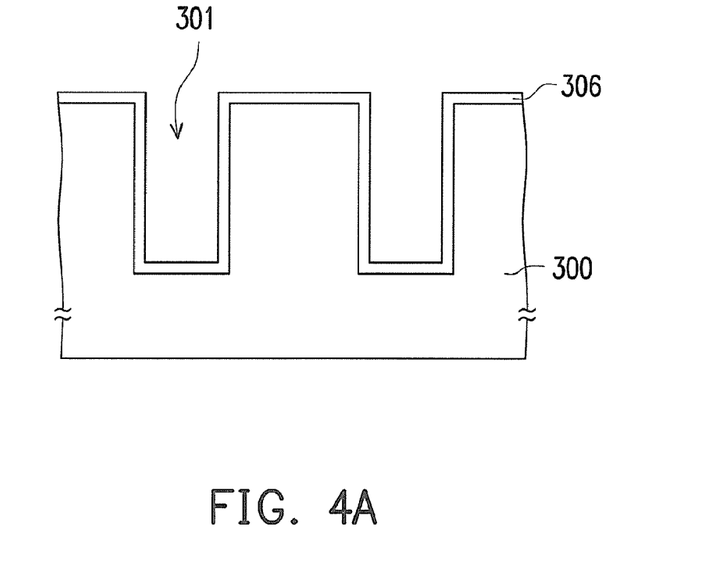
FIGS. 4A to 4C schematically illustrate cross-sectional views of a process flow of the non-volatile memory taken along the cross-section II-II' of FIG. 3A.
Figure 4B:
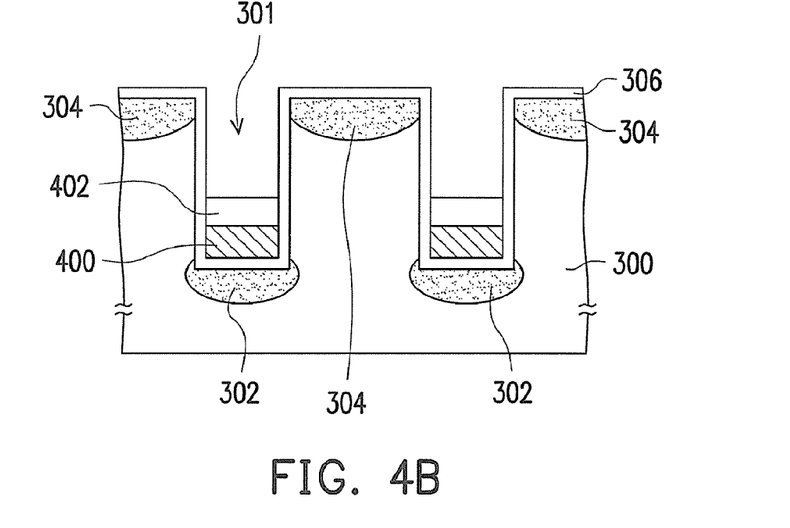
Figure 4C:
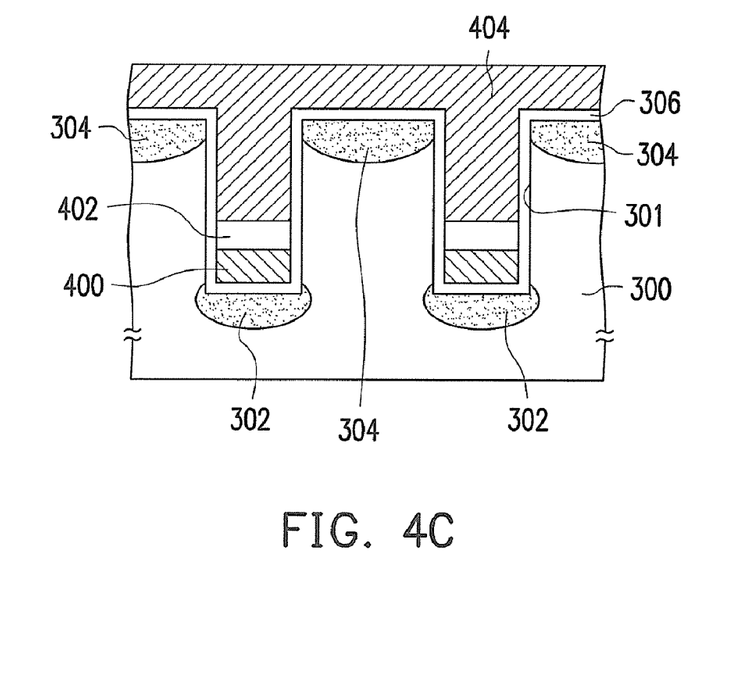

FIGS. 4A to 4C schematically illustrate cross-sectional views of a process flow of the non-volatile memory taken along the cross-section II-II' of FIG. 3A. In FIGS. 4A to 4C, the same elements with FIGS. 3A and 3B are represented by same reference numbers, and the details are not iterated herein. First, referring to FIG. 4A, a substrate 300 is provided. Thereafter, a plurality of trenches 301 are formed, extending along a first direction Y, in the substrate 300. Afterwards, a charge-trapping structure 306 is conformally formed on the substrate 300.

Referring to FIG. 4B, an ion implantation process is performed, so as to form a plurality of first doped regions 302, extending along the first direction Y, in the substrate at bottoms of the trenches 301, and a plurality of second doped regions 304, extending along the first direction Y, in the substrate 300 between the trenches 301. Thereafter, a first conductive layer 400 is formed, extending along the first direction Y, on the bottoms of the trenches 301. The method of forming the first conductive layer 400 includes forming a conductive material layer filling up the trenches 301; and performing an etching process, so as to remove the conductive material layer outside the trenches 301 and a portion of the conductive material layer in the trenches 301, and retain the conductive material layer on the bottoms of the trenches 301. The first conductive layer 400 includes the first gates 308 in FIGS. 3A and 3B. Thereafter, an insulating layer 402 is formed on the first conductive layer 400. The method of forming the insulating layer 402 includes forming an insulating material layer on the charge-trapping structure 306 filling up the trenches 301; and performing an etching process, so as to remove the insulating material layer outside the trenches 301 and a portion of the insulating material layer in the trenches 301, and retain the insulating material layer on the first conductive layer 400. The insulating layer 402 is the inter-gate insulating layer 312 in FIGS. 3A and 3B.

Referring to FIG. 4C, a plurality of second conductive layers 404 each having a stripe shape are formed on the charge-trapping layer 306 in a second direction X, and the second conductive layers 404 fill in the trenches 301. The method of forming the second conductive layers 404 includes forming a conductive material layer on the charge-trapping structure 306 filling up the trenches 301; and performing a patterning process to remove the conductive material layer outside the trenches 301 and a portion of the conductive layer in the trenches 301 in the second direction X, so as to form the second conductive layers 404 each having a stripe shape. The second conductive layers 404 are the second gates 310 in FIGS. 3A and 3B.

The memory cell 10a in FIG. 1B is taken as an example to illustrate an operating method of a memory cell according to an embodiment of the present invention.

Figure 5A:
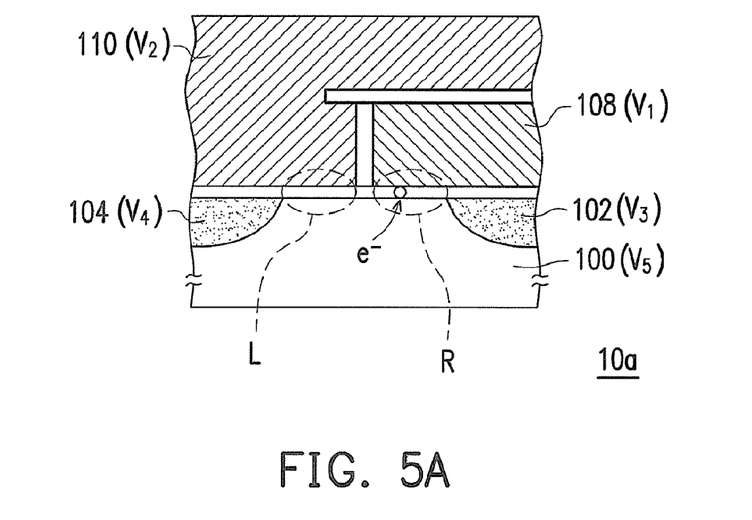
FIG. 5A schematically illustrates a programming operation of a memory cell according to an embodiment of the present invention.

FIG. 5A schematically illustrates a programming operation of a memory cell according to an embodiment of the present invention. Referring to FIG. 5, when a programming operation is performed to the memory cell 10a, a voltage $V_1$ is applied to the first gate 108, a voltage $V_2$ is applied to the second gate 110, a voltage $V_3$ is applied to the first doped region 102, a voltage $V_4$ is applied to the second doped region 104, and a voltage $V_5$ is applied to the substrate 100.

In details, when the programming operation is executed to the right bit R of the memory cell 10a through the CHE injection (that is, storing electrons into the charge-trapping structure 106 below the first gate 108), the voltages $V_1$ and $V_2$ are high voltages that are substantially the same and range, for example, from 9 V to 13 V, so that the channel between the first doped region 102 and the second doped region 104 is strongly turned-on; the voltage $V_3$ is from 3.5 V to 5.5 V, for example; the voltage $V_4$ is 0 V, for example; and the voltage $V_5$ is 0 V, for example. Thus, electrons are accelerated by the lateral electric field, so as to be injected into the charge-trapping structure 106 below the first gate 108. Similarly, when the programming operation is executed to the left bit L of the memory cell 10a through the CHE injection (that is, storing electrons into the charge-trapping structure 106 below the second gate 110), the voltages $V_1$ and $V_2$ are high voltages that are substantially the same and range, for example, from 9 V to 13 V, so that the channel between the first doped region 102 and the second doped region 104 is strongly turned-on; the voltage $V_3$ is 0 V, for example; the voltage $V_4$ ranges from 3.5 V to 5.5 V, for example; and the voltage $V_5$ is 0 V, for example. Thus, electrons are accelerated by the lateral electric field, so as to be injected into the charge-trapping structure 106 below the second gate 110.

Additionally, when the programming operation is executed to the right bit R of the memory cell 10a through the enhanced CHE injection, the voltage $V_1$ ranges, for example, from 9 V to 13 V, so that the channel below the first gate 108 is strongly turned-on; the voltage $V_2$ ranges, for example, from 1.5 V to 3 V, so that the channel below the second gate 110 is weakly turned-on; the voltage $V_3$ ranges from 3.5 V to 5.5 V, for example; the voltage $V_4$ is 0 V, for example; and the voltage $V_5$ is 0 V, for example. A higher vertical electric field is obtained by applying a relatively high voltage to the first gate 108, and a higher lateral electric field is obtained by applying a relatively low voltage to the second gate 110, so that the programming operation becomes more efficient. Similarly, when the programming operation is executed to the left bit L of the memory cell 10a through the enhanced CHE injection, the voltage $V_1$ ranges, for example, from 1.5 V to 3 V, so that the channel below the first gate 108 is weakly turned-on; the voltage $V_2$ ranges, for example, from 9 V to 13 V, so that the channel below the second gate 110 is strongly turned-on; the voltage $V_3$ is 0 V, for example; the voltage $V_4$ ranges from 3.5 V to 5.5 V, for example; and the voltage $V_5$ is 0 V, for example. A higher lateral electric field is obtained by applying a relatively low voltage to the first gate 108, and a higher vertical electric field is obtained by applying a relatively high voltage to the second gate 110, so that the programming operation becomes more efficient.

Furthermore, after the aforementioned programming operation, an erasing operation is then performed to the data stored in the memory cell 10a.

Figure 5B:
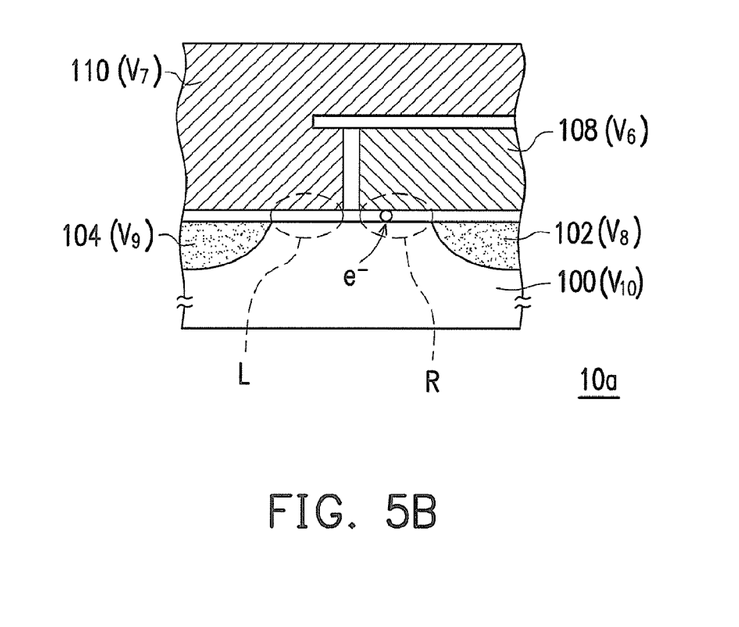
FIG. 5B schematically illustrates an erasing operation of a memory cell according to an embodiment of the invention.

FIG. 5B schematically illustrates an erasing operation of a memory cell according to an embodiment of the invention. Referring to FIG. 5B, when an erasing operation is performed to the programmed memory cell 10a, a voltage $V_6$ is applied to the first gate 108; a voltage $V_7$ is applied to the second gate 110; a voltage $V_8$ is applied to the first doped region 102; a voltage $V_9$ is applied to the second doped region 104; and a voltage $V_{10}$ is applied to the substrate 100.

Specifically, when the erasing operation is performed to the right bit R of the programmed memory cell 10a through the BBHH, the voltage $V_6$ ranges from −11 V to −15 V, for example; the voltage $V_7$ is 0 V, floating or from −11 V to −15 V, for example; the voltage $V_8$ ranges from 4 V to 5 V, for example; the voltage $V_9$ is 0 V or floating, for example; and the voltage $V_{10}$ is 0 V, for example. As a consequence, holes are injected into the charge-trapping structure 106 below the first gate 108 to combine with electrons so as to erase the data stored in the right bit R of the memory cell 10a. Similarly, when the erasing operation is performed to the left bit L of the programmed memory cell 10a through the BBHH, the voltage $V_6$ is 0 V, floating or from −11 V to −15 V, for example; the voltage $V_7$ ranges from −11 V to −15 V, for example; the voltage $V_8$ is 0 V or floating, for example; the voltage $V_9$ ranges from 4 V to 5 V, for example; and the voltage $V_{10}$ is 0 V, for example. As a consequence, holes are injected into the charge-trapping structure 106 below the second gate 110 to combine with electrons so as to erase the data stored in the left bit L of the memory cell 10a.

Furthermore, after the aforementioned programming operation, a reading operation is then performed to the data stored in the memory cell 10a.

Figure 5C:
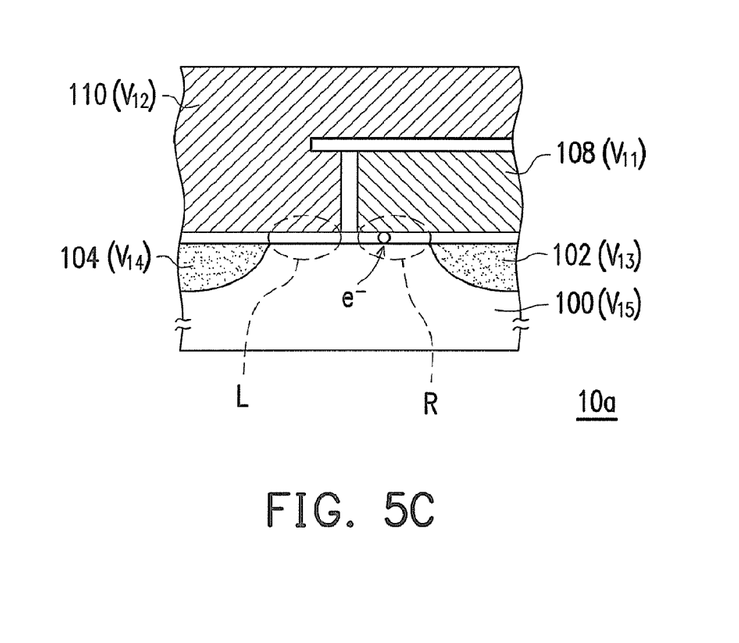
FIG. 5C schematically illustrates a reading operation of a memory cell according to an embodiment of the invention.

FIG. 5C schematically illustrates a reading operation of a memory cell according to an embodiment of the invention. Referring to FIG. 5C, when a reading operation is performed to the programmed memory cell 10a, a voltage $V_{11}$ is applied to the first gate 108; a voltage $V_{12}$ is applied to the second gate 110; a voltage $V_{13}$ is applied to the first doped region 102; a voltage $V_{14}$ is applied to the second doped region 104; and a voltage $V_{15}$ is applied to the substrate 100.

When the reading operation is performed to the right bit R of the memory cell 10a, the voltage $V_{11}$ ranges from 0 V to 6 V, for example; the voltage $V_{12}$ ranges from 5 V to 9.5 V, for example; the voltage $V_{13}$ is 0 V, for example; the voltage $V_{14}$ ranges from 0.7 V to 1.6 V, for example; and the voltage $V_{15}$ is 0 V, for example. When the data stored in the right bit R is being read, the second gate 110 in the left bit L is applied with a relatively high voltage, the second bit effect is therefore inhibited and the operation window is consequently increased. Further, when the reading operation is performed to the right bit R of the memory cell 10a, a high voltage is applied to the second gate 110 on the non-reading side to inhibit the second bit effect, and thus, applying a high voltage to the second doped region 104 to inhibit the second bit effect in the conventional techniques is not required, and the problem of reading disturbance is solved. Similarly, when the reading operation is performed to the left bit L of the memory cell 10a, the voltage $V_{11}$ ranges from 5 V to 9.5 V, for example; the voltage $V_{12}$ ranges from 0 V to 6 V, for example; the voltage $V_{13}$ ranges from 0.7 V to 1.6 V, for example; the voltage $V_{14}$ is 0 V, for example; and the voltage $V_{15}$ is 0 V, for example. When the data stored in the left bit L is being read, the first gate 108 in the right bit R is applied with a relatively high voltage, the second bit effect is therefore inhibited and the operation window is consequently increased. Further, when the reading operation is performed to the left bit L of the memory cell 10a, a high voltage is applied to the first gate 108 on the non-reading side to inhibit the second bit effect, and thus, applying a high voltage to the first doped region 102 to inhibit the second bit effect in the conventional techniques is not required, and the problem of reading disturbance is solved.

It is noted that the operating method of the memory cell 10a can be applied to operate the memory cell 30a. The programming, erasing and reading operations of the memory cell 30a can be easily achieved by persons skilled in the art according to the programming, erasing and reading operations of the memory cell 10a, and the details are not iterated herein.

In summary, the non-volatile memory of the present invention has the first gates and the second gates crossover the first gates, so that each memory cell has two gates. Therefore, when a programming operation is performed, appropriate voltages are respectively applied to the first gate and the second gate of each memory cell to execute CHE injection or enhanced CHE injection, and thus, the programming efficiency is increased and the performance of the device is enhanced.

Further, when a reading operation is performed to the memory cell, a high voltage is applied to the gate on the non-reading side, so as to inhibit the second bit effect and increase the operation window.

In addition, when a reading operation is performed to the memory cell, a high voltage is applied to the gate on the non-reading side to inhibit the second bit effect, and thus, applying a high voltage to the doped region below the gate on the non-reading side to inhibit the second bit effect in the conventional techniques is not required, and the reading disturbance is effectively alleviated.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A non-volatile memory, comprising:
   a substrate;
   a plurality of first doped regions each having a stripe shape, disposed in the substrate and extending along a first direction;
   a plurality of second doped regions each having a stripe shape, disposed in the substrate and extending along the first direction, wherein the first doped regions and the second doped regions are arranged alternately;
   a charge-trapping structure, disposed on the substrate;
   a plurality of first gates each having a stripe shape, disposed on the charge-trapping structure and extending along the first direction, wherein each first gate is disposed on one of the first doped regions;
   a plurality of second gates each having a stripe shape, disposed on the charge-trapping structure, extending along a second direction and located on the second doped regions, wherein the second direction is different from the first direction; and
   an inter-gate insulating layer, disposed between the first gates and the second gates,
   wherein a first doped region, a second doped region adjacent to the first doped region, and a first gate, a second gate and the charge-trapped structure which are disposed between the first doped region and the second doped region define a memory cell.

2. The non-volatile memory of claim 1, wherein a width of each first gate is greater than a width of each first doped region.

3. The non-volatile memory of claim 1, wherein the substrate has a plurality trenches therein, each first doped region is disposed below one of the trenches, each first gate is disposed on a bottom of one of the trenches, and the second gates fill in the trenches in the second direction.

4. The non-volatile memory of claim 1, wherein the charge-trapping structure is a composite structure comprising a bottom oxide layer, a charge-trapping layer and a top oxide layer.

5. The non-volatile memory of claim 4, wherein a material of the charge-trapping layer comprises nitride or a high-k material.

6. The non-volatile memory of claim 5, wherein the high-k material comprises $HfO_2$, $TiO_2$, $ZrO_2$, $Ta_2O_5$ or $Al_2O_3$.

7. An operating method of a memory cell, comprising:
   providing the memory cell of claim 1,
   wherein when a programming operation is performed, a first voltage is applied to the first gate; a second voltage is applied to the second gate; a third voltage is applied to the first doped region; a fourth voltage is applied to the second doped region; and a fifth voltage is applied to the substrate.

8. The operating method of claim 7, wherein when the programming operation is executed through a channel hot electron injection, the first voltage and the second voltage are substantially the same, wherein the first voltage is from 9 V to 13 V; the second voltage is from 9 V to 13 V; one of the third voltage and the fourth voltage is 0 V while the other is from 3.5 V to 5.5 V; and the fifth voltage is 0 V.

9. The operating method of claim 7, wherein when the programming operation is executed through an enhanced channel hot electron injection, one of the first voltage and the second voltage is from 9 V to 13 V while the other is from 1.5 V to 3 V; one of the third voltage and the fourth voltage is from 0 V while the other is from 3.5 V to 5.5 V; and the fifth voltage is 0 V.

10. The operating method of claim 7, further comprising performing an erasing operation after performing the programming operation, wherein when the erasing operation is performed, a sixth voltage is applied to the first gate; a seventh voltage is applied to the second gate; a eighth voltage is applied to the first doped region; a ninth voltage is applied to the second doped region; and a tenth voltage is applied to the substrate.

11. The operating method of claim 10, wherein when the erasing operation is executed through a band-to-band hot hole, one of the sixth voltage and the seventh voltage is 0 V, floating or from −11 V to −15 V while the other is from −11 V to −15 V; one of the eighth voltage and the ninth voltage is 0 V or floating while the other is from 4 V to 5 V; and the tenth voltage is 0 V.

12. The operating method of claim 7, further comprising performing a reading operation after performing the programming operation, wherein when the reading operation is performed, an eleventh voltage is applied to the first gate; a twelfth voltage is applied to the second gate; a thirteenth voltage is applied to the first doped region; a fourteenth voltage is applied to the second doped region; and a fifteenth voltage is applied to the substrate.

13. The operating method of claim 12, wherein one of the eleventh voltage and the twelfth voltage is from 5 V to 9.5 V while the other is from 0 V to 6 V; one of the thirteenth voltage and the fourteenth voltage is from 0.7 V to 1.6 V while the other is 0 V; and the fifteenth voltage is 0 V.

14. An operating method of a memory cell, comprising:
providing the memory cell of claim 3,
wherein when a programming operation is performed, a first voltage is applied to the first gate; a second voltage is applied to the second gate; a third voltage is applied to the first doped region; a fourth voltage is applied to the second doped region; and a fifth voltage is applied to the substrate.

15. The operating method of claim 14, wherein when the programming operation is executed through a channel hot electron injection, the first voltage and the second voltage are substantially the same, wherein the first voltage is from 9 V to 13 V; the second voltage is from 9 V to 13 V; one of the third voltage and the fourth voltage is 0 V while the other is from 3.5 V to 5.5 V; and the fifth voltage is 0 V.

16. The operating method of claim 14, wherein when the programming operation is executed through an enhanced channel hot electron injection, one of the first voltage and the second voltage is from 9 V to 13 V while the other is from 1.5 V to 3 V; one of the third voltage and the fourth voltage is from 0 V while the other is from 3.5 V to 5.5 V; and the fifth voltage is 0 V.

17. The operating method of claim 14, further comprising performing an erasing operation after performing the programming operation, wherein when the erasing operation is performed, a sixth voltage is applied to the first gate; a seventh voltage is applied to the second gate; a eighth voltage is applied to the first doped region; a ninth voltage is applied to the second doped region; and a tenth voltage is applied to the substrate.

18. The operating method of claim 17, wherein when the erasing operation is executed through a band-to-band hot hole, one of the sixth voltage and the seventh voltage is 0 V, floating or from −11 V to −15 V while the other is from −11 V to −15 V; one of the eighth voltage and the ninth voltage is 0 V or floating while the other is from 4 V to 5 V; and the tenth voltage is 0 V.

19. The operating method of claim 14, further comprising performing a reading operation after performing the programming operation, wherein when the reading operation is performed, an eleventh voltage is applied to the first gate; a twelfth voltage is applied to the second gate; a thirteenth voltage is applied to the first doped region; a fourteenth voltage is applied to the second doped region; and a fifteenth voltage is applied to the substrate.

20. The operating method of claim 19, wherein one of the eleventh voltage and the twelfth voltage is from 5 V to 9.5 V while the other is from 0 V to 6 V; one of the thirteenth voltage and the fourteenth voltage is from 0.7 V to 1.6 V while the other is 0 V; and the fifteenth voltage is 0 V.

* * * * *